United States Patent
Kronholz et al.

(10) Patent No.: US 9,548,378 B2
(45) Date of Patent: Jan. 17, 2017

(54) EPITAXIAL CHANNEL FORMATION METHODS AND STRUCTURES

(75) Inventors: Stephan Kronholz, Dresden (DE); Nadja Zakowsky, Radeburg (DE); Yew Tuck Chow, Dresden (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 1100 days.

(21) Appl. No.: 13/369,856

(22) Filed: Feb. 9, 2012

(65) Prior Publication Data

US 2013/0210216 A1 Aug. 15, 2013

(51) Int. Cl.
*H01L 21/20* (2006.01)
*H01L 29/66* (2006.01)
*H01L 29/78* (2006.01)
*H01L 29/10* (2006.01)
*H01L 21/02* (2006.01)

(52) U.S. Cl.
CPC ..... *H01L 29/66651* (2013.01); *H01L 21/0245* (2013.01); *H01L 29/1054* (2013.01); *H01L 29/7833* (2013.01); *H01L 21/02035* (2013.01); *H01L 21/0243* (2013.01); *H01L 21/02532* (2013.01); *H01L 21/02617* (2013.01)

(58) Field of Classification Search
CPC ........... H01L 21/02035; H01L 21/0243; H01L 21/02381; H01L 21/0245; H01L 21/02532; H01L 29/66651; H01L 29/1054; H01L 29/7833; H01L 21/02617
USPC ............................................ 438/483; 257/65
See application file for complete search history.

(56) References Cited

U.S. PATENT DOCUMENTS

| | | | | |
|---|---|---|---|---|
| 4,486,461 | A * | 12/1984 | Ito | C30B 33/005 118/50.1 |
| 5,607,511 | A * | 3/1997 | Meyerson | C23C 16/24 118/715 |
| 7,608,526 | B2 * | 10/2009 | Cody et al. | 438/481 |
| 8,796,080 | B2 * | 8/2014 | Kronholz et al. | 438/163 |
| 2005/0062080 | A1 * | 3/2005 | Nakamura et al. | 257/288 |
| 2006/0138398 | A1 * | 6/2006 | Shimamune et al. | 257/19 |
| 2006/0138541 | A1 * | 6/2006 | Nakamura et al. | 257/347 |
| 2007/0166904 | A1 * | 7/2007 | Teo et al. | 438/197 |
| 2008/0079086 | A1 * | 4/2008 | Jung et al. | 257/369 |
| 2008/0081112 | A1 * | 4/2008 | Brabant | C30B 23/06 427/248.1 |

(Continued)

*Primary Examiner* — Michael Trinh
(74) *Attorney, Agent, or Firm* — Lorenz & Kopf, LLP

(57) ABSTRACT

A method for forming field effect transistors (FETs) in a multiple wafers per batch epi-reactor includes, providing substrates having therein at least one semiconductor (SC) region with a substantially flat outer surface, modifying such substantially flat outer surface to form a convex-outward curved surface, forming an epitaxial semiconductor layer on the curved surface, and incorporating the epitaxial layer in a field effect transistor formed on the substrate. Where the SC region is of silicon, the epitaxial layer can include silicon-germanium. In a preferred embodiment, the epi-layer forms part of the FET channel. Because of the convex-outward curved surface, the epi-layer grown thereon has much more uniform thickness even when formed in a high volume reactor holding as many as 100 or more substrates per batch. FETs with much more uniform properties are obtained, thereby greatly increasing the manufacturing yield and reducing the cost.

13 Claims, 7 Drawing Sheets

(56) References Cited

U.S. PATENT DOCUMENTS

| | | | |
|---|---|---|---|
| 2008/0128852 A1* | 6/2008 | Tasaka | 257/506 |
| 2009/0194821 A1* | 8/2009 | Kaneko et al. | 257/377 |
| 2011/0076812 A1* | 3/2011 | Lee et al. | 438/198 |
| 2011/0097881 A1* | 4/2011 | Vandervorst et al. | 438/486 |
| 2012/0049194 A1* | 3/2012 | Scheiper et al. | 257/65 |
| 2012/0085278 A1* | 4/2012 | Moslehi | C23C 16/45585 117/104 |
| 2012/0299155 A1* | 11/2012 | Liu | 257/609 |
| 2013/0105917 A1* | 5/2013 | Kronholz et al. | 257/410 |
| 2013/0224952 A1* | 8/2013 | Chang et al. | 438/682 |

* cited by examiner

EPITAXIAL CHANNEL FORMATION METHODS AND STRUCTURES

FIELD OF THE INVENTION

This invention relates generally to methods and structures for forming semiconductor devices incorporating an epitaxial channel region, especially field effect transistors (FETs).

BACKGROUND OF THE INVENTION

Epitaxial growth of semiconductor regions is a well known semiconductor device and integrated circuit (IC) fabrication technique. Despite the fact that epitaxial growth has been used for decades it is not free from difficulties and challenges, especially as device dimensions have become smaller and smaller and the materials used in the epitaxial layers or regions have become more complex, often times different than the substrate on which the epitaxial regions or layers are being formed, or both. Further, the ongoing need for continuing cost reductions in the manufacture of semiconductor devices and ICs prompts the introduction of epitaxial reactors adapted to process larger numbers of semiconductor wafers in a single fabrication batch. Use of such higher volume processing tools can give rise to epitaxial deposition problems not encountered with earlier low volume processing tools. Accordingly, there is an ongoing need for improved epitaxial fabrication methods and structures, especially in connection with manufacture of field effect transistors (FETs), including metal-oxide-semiconductor-field-effect-transistors (MOSFETs), particularly when being transitioned from low volume to high volume epitaxial deposition tools.

BRIEF SUMMARY OF THE INVENTION

A method for forming field effect transistors (FETs) (44) in a multiple wafers per batch epi-reactor, includes: providing substrates (21) having therein at least one semiconductor (SC) region (47) with a substantially flat outer surface (472'), modifying such substantially flat outer surface (472') to form a convex-outward curved surface (472), forming an epitaxial semiconductor layer (43) on the curved surface (472), and incorporating the epitaxial layer (43) in a field effect transistor (44) formed on the substrates (21). Where the SC region (47) is of silicon, the epitaxial layer (43) can include silicon-germanium. In a preferred embodiment, the epi-layer (43) forms part of the FET (44) channel. Because of the convex-outward curved surface, the epi-layer (43) grown thereon has much more uniform thickness (431) even when formed in a multi-wafer reactor holding as many as 100 or more substrates (21) per batch. FETs with much more uniform properties are obtained, thereby greatly increasing the manufacturing yield and reducing the manufacturing cost.

BRIEF DESCRIPTION OF THE DRAWINGS

The invention will be better understood from a reading of the following detailed description, taken in conjunction with the accompanying figures in the drawings in which like numerals denote like or analogous elements, and wherein.

DETAILED DESCRIPTION OF THE INVENTION

Figure 1:
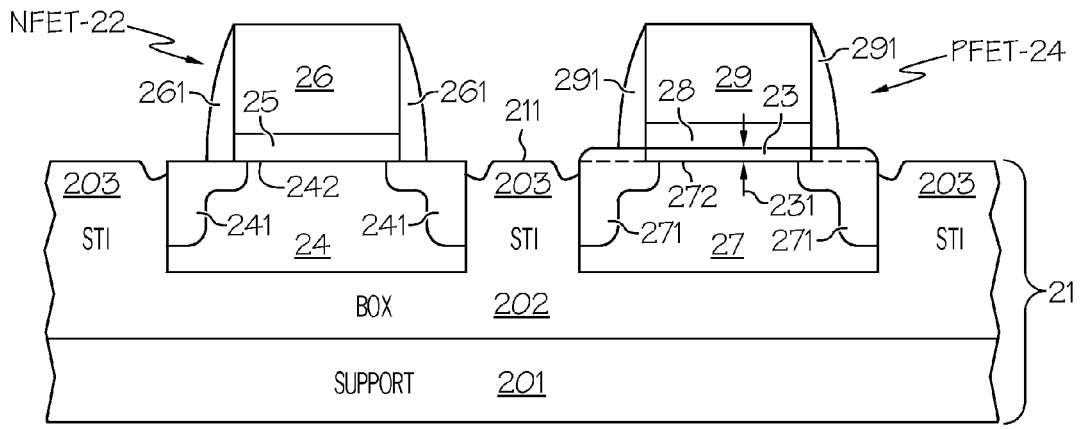
FIG. 1 shows a simplified cross-sectional view of a semiconductor device or portion of an integrated circuit (IC) embodying an N-type FET ("NFET") and a P-type FET ("PFET"), with an epitaxial channel region of the PFET fabricated in a low volume (e.g., a single wafer) epi-reactor according to the prior art.

The following detailed description is merely exemplary in nature and is not intended to limit the invention or the application and uses of the invention. Furthermore, there is no intention to be bound by any expressed or implied theory presented in the preceding technical field, background, or the following detailed description. For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "comprise," "include," "have" and any variations thereof used herein, are intended to cover non-exclusive inclusions, such that a process, method, article, or apparatus that "comprises", "includes" or has a list of elements or steps, is not necessarily limited to those elements or steps, but may include other elements or steps not expressly listed or inherent to such process, method, article, or apparatus. As used herein the terms "substantial" and "substantially" mean sufficient to accomplish the stated purpose in a practical manner and that minor imperfections, if any, are not significant for the stated purpose. Furthermore, the terms "first," "second," "third," and the like in the description and the claims, if any, may be used for distinguishing between somewhat similar elements and not necessarily for describing a particular spatial arrangement or sequence or chronological order. It is to be understood that the terms so used are interchangeable under appropriate circumstances such that the embodiments of the invention described herein are, for example, capable of operation or fabrication in sequences, orientations and arrangements other than those illustrated or otherwise described herein.

Metal-oxide-semiconductor (MOS) devices are a well known form of field effect transistors (FETs). Complimentary metal-oxide-semiconductor (CMOS) devices, that is, with both P-channel (PMOS) and N-channel (NMOS) devices, are much used in integrated circuits (ICs). The term metal-oxide-semiconductor and the abbreviation "MOS" are widely used in the art to refer to insulated gate field effect transistors or devices (IGFETs) irrespective of whether they employ metals or some other form of conductor for the gates of such devices, and irrespective of whether they use oxides or some other form of dielectrics for the gate insulators. Semiconductors, doped semiconductors, metals, metal alloys, metal-semiconductor alloys, semi-metals and combinations thereof are non-limiting examples of suitable gate conductors. Oxides, nitrides, fluorides, combinations thereof and other inorganic and organic dielectrics are non-limiting examples of suitable gate insulators. Accordingly, the terms metal-oxide-semiconductor and the abbreviations MOS, MOSFET, PMOS, PFET, NMOS NFET and CMOS as used herein are intended to refer broadly to such insulated gate field effect transistors or devices and not be limited merely to those employing just metals and/or just oxides.

For convenience of explanation, embodiments of the invention are described herein for MOSFETs employing silicon (Si) semiconductors and, by way of example and not limitation, silicon-germanium (Si—Ge) epitaxial material. However, persons of skill in the art will understand that the invention is not limited merely to Si semiconductors and Si—Ge epitaxial material, but also applies to other semiconductor materials and other epitaxial materials and other types of SC devices where introduction of epitaxial regions or layers can improve overall device properties. Further, as used herein, the term "semiconductor" and the abbreviation "SC", singular or plural, are intended to include any kind of semiconductor material, including but not limited to single crystal semiconductors, polycrystalline semiconductors, amorphous semiconductors as well as organic and inorganic semiconductors. As used herein, the terms "substrate" and "wafer", singular or plural, are intended to be used interchangeably and to include bulk semiconductor substrates, insulating substrates, and combinations thereof, such as but not intended to be limiting, semiconductor-on-insulator (SOI) substrates and insulator-on-semiconductor (IOS) substrates. Substrates may be single crystal, polycrystalline, amorphous, laminated or combinations thereof. For convenience of description, various conductors may be referred to as "metals", but unless indicated otherwise by the particular context, the words "metal" and "conductor", singular or plural, should be interpreted broadly to include any type of electrical conductor, whether metallic or not.

FIG. 1 shows a simplified cross-sectional view of semiconductor device or portion of an integrated circuit (IC) 20 (hereafter collectively SC device 20) embodying N-type FET ("NFET") 22 and P-type FET ("PFET") 24, with epitaxial channel region 23 of PFET 24, fabricated in a low volume (e.g., single wafer per batch) epi-reactor according to the prior art. SC device 20 is formed in substrate 21 having upper surface 211. Support 201, as for example a semiconductor wafer, is provided in substrate 21. Overlying support 201 is buried oxide layer (BOX) 202 of, for example silicon oxide, however any substantially refractory dielectric may be used for BOX 202 whether oxide or not. Semiconductor (SC) regions 24, 27 having upper surfaces 242, 272, respectively, are formed within substrate 21 over BOX 202 and extending to upper surface 211. SC regions 24, 27 are in this example separated at surface 211 by shallow trench isolation (STI) regions 203.

SC region 24 is P-type to be used for formation of NFET 22. Located within P-type SC region 24 are, for example, N+ source-drain regions 241 also extending to surface 242. NFET 22 has gate insulator or dielectric 25 in contact with surface 242 of SC region 24 and gate conductor 26 overlying and in contact with gate insulator or dielectric 25. Dielectric sidewalls 261 are conveniently but not essentially provided covering the lateral sidewalls of gate conductor 26. Gate conductor 26 extends laterally above the gap between source-drain regions 241 that underlie gate insulator or dielectric 25. When gate 26 is appropriately biased with respect to SC region 24, a conductive channel forms between source-drain regions 241. This is conventional.

SC region 27 is N-type to be used for formation of PFET 24. Located within N-type SC region 27 are, for example, P+ source-drain regions 271 also extending to surface 272. PFET 24 has gate insulator or dielectric 28 overlying surface 272 of SC region 27 and gate conductor 29 overlying and in contact with gate insulator or dielectric 28. Dielectric sidewalls 291 are conveniently but not essentially provided covering the lateral sidewalls of gate conductor 29. Located between gate insulator 28 and surface 272 of SC region 27 is epitaxial SC region or layer 23 of thickness 231, of the same conductivity type as SC region 27. Where SC region 27 is of silicon, then Si—Ge is a suitable material for epitaxial layer 23. Thickness 231 of epi-layer 23 is usefully in the range of about 0.1 to 100 nanometers and preferably about 1 to 20 nanometers. Epitaxial layer 23 (e.g., of Si—Ge) provides a valence band offset that allows the threshold voltage of PFET 24 to be appropriately adjusted compared to the threshold voltage of NFET 22 to provide better overall CMOS device or circuit performance. Gate conductor 29 extends laterally above the gap between source-drain regions 271 that underlie gate insulator or dielectric 28. When gate 29 is appropriately biased with respect to SC region 27, a conductive channel forms between source-drain regions 271, at least partly in epi-layer 23.

Figure 2:
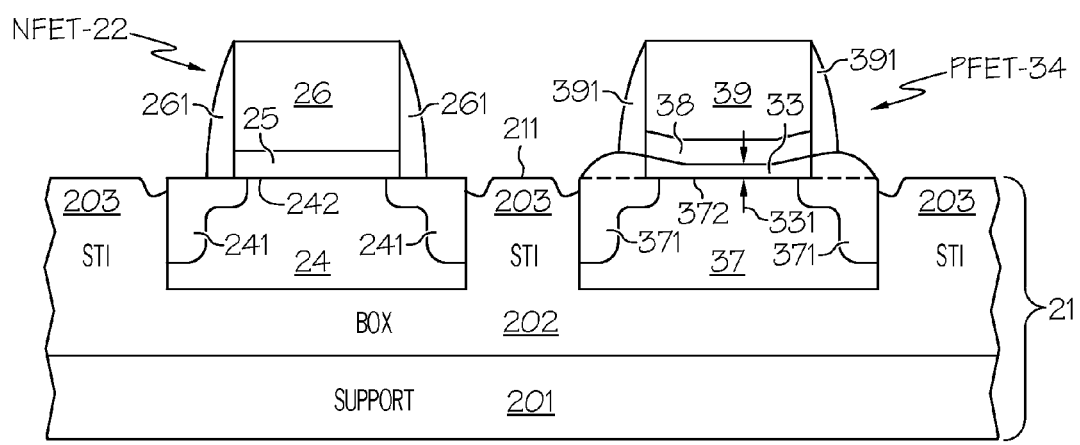
FIG. 2 shows a simplified cross-sectional view of a semiconductor device or portion of an IC embodying an N-type FET ("NFET") and a P-type FET ("PFET"), with an epitaxial channel region of the PFET fabricated in a higher volume epi-reactor than used to form the device or IC portion of FIG. 1, illustrating a problem encountered in transitioning from such a low volume (e.g., 1 wafer per batch) to a higher volume (e.g., multiple wafers per batch) epitaxial deposition process and tool.

FIG. 2 shows a simplified cross-sectional view of semiconductor device or portion of an IC 30 (hereafter collectively SC device 30) embodying N-type FET ("NFET") 22 and P-type FET ("PFET") 34, with epitaxial channel region 33 in PFET 34 fabricated in a higher volume (e.g., multiple wafers per batch) epi-reactor than that used to form SC device 20 of FIG. 1, illustrating a problem encountered in transitioning from such low volume (e.g., 1 wafer per batch) to a higher volume (e.g., multiple wafers per batch) epitaxial deposition tool (epi-reactor). The lower volume epi-tool used was a one wafer per batch, Epsilon Epitaxy Reactor, provided by ASM America Corporation of 3440 E. University Drive, Phoenix, Ariz., 85032-7200, USA. The higher volume epi-tool used was a QUIXACE Batch Epitaxial Reactor, provided by Kokusai Semiconductor Equipment Corporation, 2460 N. First Street #290, San Jose, Calif. 95131 USA, which can hold as many as 100 wafer per batch.

NFET 22 of SC device 30 is substantially the same as NFET 22 of SC device 20 and the discussion thereof in connection with FIG. 1 is incorporated herein by reference. PFET device 34 is generally analogous in function to PFET 24 of FIG. 1, although differing in properties, and is formed by N-type SC region 37 with upper surface 372, analogous to region 27 of FIG. 1, and with P+ source-drain regions 371 analogous to regions 271 of FIG. 1. Overlying surface 372 of SC region 37 is gate insulator 38 analogous to gate insulator 28 of FIG. 1 and conductive gate 39 analogous to gate 29 of FIG. 1. Lying between gate insulator 38 and SC surface 372 is epitaxial layer or region 33 of local thickness 331, generally analogous in function but not detail to layer 23 of FIG. 1. Where SC regions 24, 37 are of silicon, epi-layer 33 is conveniently of Si—Ge but other SC materials may also be used and other epi-layer materials may also be used.

Device 30 of FIG. 2 and device 20 of FIG. 1 differ primarily in how epi-layers 33 and 23, respectively, are formed and the resulting epi-layer properties. As illustrated in FIG. 2, epi-layer 33 formed in a relatively high volume epi-reactor (e.g., ~100 wafer per batch) exhibited significant thickness non-uniformity, that is, local thickness 331 of epi-layer 33 varied significantly laterally across semiconductor region 37. Epi-layer 33 is often found to have excessive edge rounding or thickness variation and can exhibit a double-hump thickness profile, such as is illustrated in FIG. 2. It has been found that the electrical properties of PFET 34 are adversely affected by such thickness non-uniformity in epi-layer 33. This in turn adversely affects overall manufacturing yield and the cost of production of ICs and SC devices incorporating epitaxial channel layers or regions produced in such higher volume epi-reactor. This negates in whole or part the anticipated cost improvement or other advantage that might be gained by using a higher volume epi-tool (e.g., multiple wafers per batch) as compared to the lower volume tool (e.g., 1 wafer per batch) of the prior art. This is undesirable.

Figure 3:
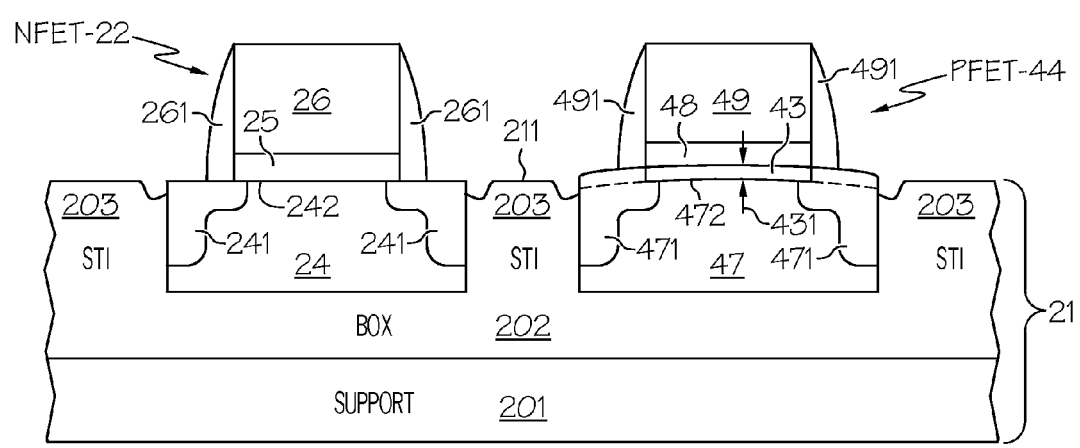
FIG. 3 shows a simplified cross-sectional view of a semiconductor device or portion of an IC embodying an N-type FET ("NFET") and a P-type FET ("PFET"), with an epitaxial channel region of the PFET fabricated in the same higher volume epi-reactor used to form the device or IC portion of FIG. 2, but according to an embodiment of the invention.

FIG. 3 shows a simplified cross-sectional view of semiconductor device or portion of an IC 40 (hereafter collectively SC device 40) embodying N-type FET ("NFET") 22 and P-type FET ("PFET") 44, with epitaxial channel region 43 in PFET 44 fabricated in the same higher volume epi-reactor used to form SC device 30 of FIG. 2, but according to an embodiment of the invention. NFET 22 of SC device 40 is substantially the same as NFET 22 of SC device 20 and the discussion thereof in connection with FIG. 1 is incorporated herein by reference. PFET device 44 is generally analogous in function to PFET 34 of FIG. 2, although differing in properties, and is formed by N-type SC region 47 with upper surface 472, analogous to region 37 of FIG. 2, and with P+ source-drain regions 471 analogous to regions 371 of FIG. 2. Overlying surface 472 of SC region 47 is gate insulator 48 analogous to gate insulator 38 of FIG. 2 and conductive gate 49 analogous to gate 39 of FIG. 2. Lying between gate insulator 48 and SC surface 472 is epitaxial layer or region 43 of local thickness 431, generally analogous in function but not detail to layer 23 of FIG. 1. In an exemplary embodiment, SC regions 24, 47 are silicon, wherein surfaces 242, 472 are [100] planes. Epi-layer 43 includes, in this embodiment, Si—Ge with concentrations from about 50% Si and 50% Ge to about 90% Si and 10% Ge, but other materials and relative concentrations may be used in other embodiments. Thickness 431 is usefully in the range from about 0.1 to about 20 nanometers, and in this embodiment, preferably from about 1 to about 10 nanometers, but other thicker or thinner layers may also be used in still further embodiments. As will be described later, it has been found that by modifying the pretreatment to which substrate 21 is subjected prior to formation of epi-layer 43, that substantially uniform epi-layer thickness 431 can be obtained in a higher volume (e.g., multiple wafers per batch) epi-reactor and with the properties of PFET 44 optimized to more appropriately match those of NFET 22 so that overall manufacturing yield and volume are improved and overall manufacturing cost reduced. This is a significant advance in the art.

FIGS. 4-9 show simplified cross-sectional views of device or IC portion 40 of FIG. 3 during various stages of manufacture 504-509, according to further embodiments of the invention. The future locations of NFET 22 and PFET 44 are indicated. Referring now to manufacturing stage 504 of FIG. 4, substrate 21 having therein support 201, BOX 202, SC region 24 with upper surface 242, SC region 47 with upper surface 472', and STI regions 203, analogous to similarly identified regions shown in FIG. 3, are provided using means well known in the art. Surface 472' of SC region 47 is denoted with a prime (') in FIGS. 4-6 to indicate that it may initially differ somewhat from surface 472 of FIGS. 3 and 7-9. Surfaces 242 and 472' are preferably of [100] crystal orientation, but other surface crystalline orientations may also be used in other embodiments. Structure 604 results.

Figure 5:
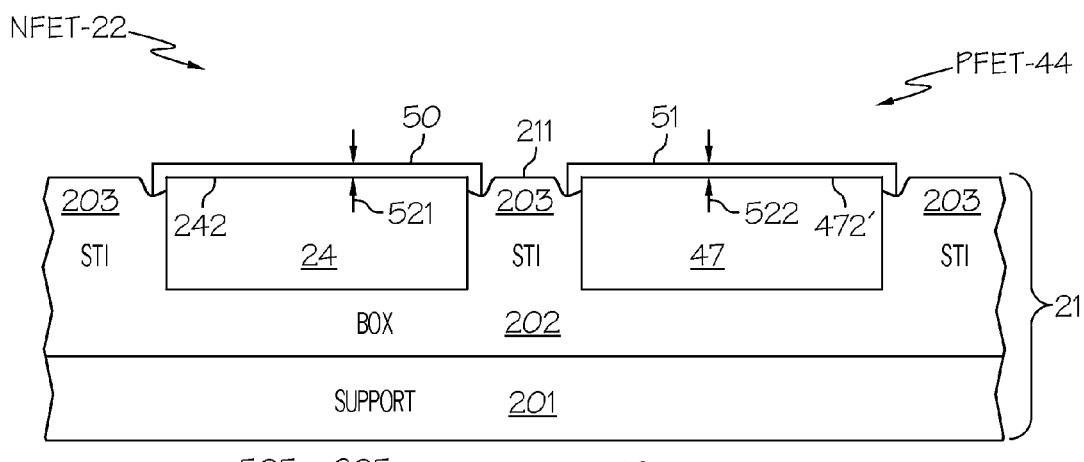

Referring now to manufacturing stage 505 of FIG. 5, protective layers 50, 51 are provided, respectively, over surface 242 of SC region 24 and surface 472' of SC region 47. It is desirable but not essential that the material of layers 50, 51 be differentially etchable with respect to STI regions 203 and surfaces 242, 472 of SC regions 27, 47. Layers 50, 51 may be (as shown) localized over SC regions 27, 47 or extend over the whole upper surface of substrate 21. Either arrangement is useful. Silicon nitride, silicon oxide and combinations thereof having thicknesses 521, 522 of at least about 1 nanometer are non-limiting examples of suitable materials for protective layers 50, 51. Thicknesses 521, 522 of layers 50, 51 can be the same or different and substantially larger provided that such larger thickness does not adversely interfere with subsequent manufacturing stages. Chemical vapor deposition (CVD) is a suitable means for forming protective layers 50, 51 but other methods and other protective materials well known in the art can also be used. Structure 605 results Referring now to manufacturing stage 506 of FIG. 6, structure 605 has mask 53 applied thereto. In the illustrated embodiment, mask 53 has closed portion 531 overlying protective layer 50 above SC region 24 and open portion 532 overlying at least protective layer 51 of structure 506. Photoresist is a non-limiting example of a suitable material for mask 53, but other masking materials may also be used. Protective layer 51 exposed under mask opening 532 is removed, preferably by differential etching, leaving behind protective layer 50 overlying surface 242 of SC region 24. In other embodiments, manufacturing stages 505 and 506 illustrated in FIGS. 5 and 6 may be combined by forming protective layer 50 only above SC region 24 and leaving surface 472' of SC region 47 bare. Either arrangement is useful. Structure 606 results.

Figure 7:
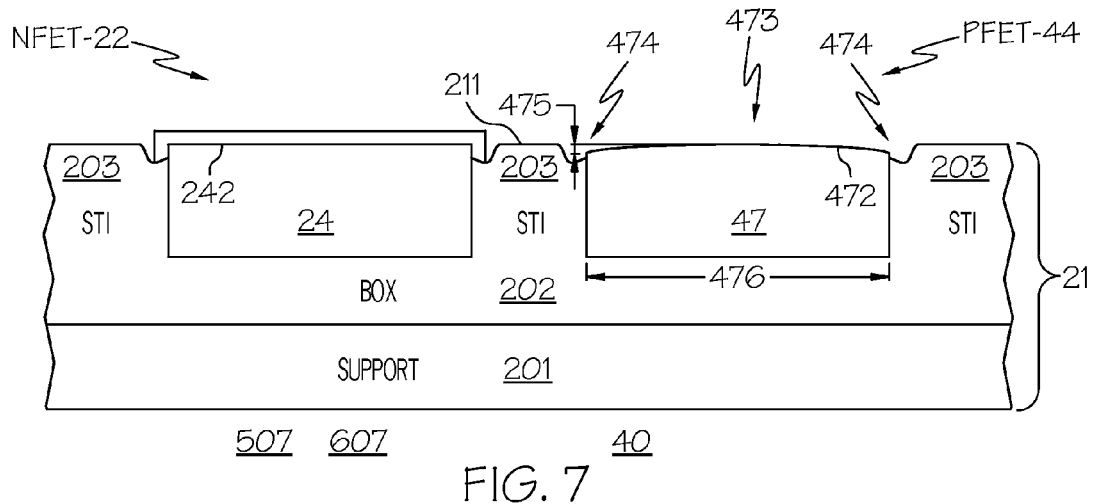

Referring now to manufacturing stage 507 of FIG. 7, mask 53 (if used) is removed so that surface 472' of SC region 47 of structure 605 is exposed while surface 242 of SC region 24 is still covered by protective layer 50. As is explained in more detail in connection with ZONES III through V of FIG. 10, after mask 53 is removed (or omitted), substrate 21 may be exposed to cleaning and baking steps that slightly etch surface 472' of SC region 47 of structure 606, so that resulting surface 472 of FIG. 7 assumes a slightly convex-outward shape. As used herein, the term "convex-outward" with respect to surface 472 is intended to refer to a surface whose central portion 473 extends further away from SC region 47 of substrate 21 than does peripheral portion 474 by differential amount 475, that is, surface 472 is higher in the middle proximate central portion 473 than at the edges proximate peripheral portion 474. Structure 607 results. By way of example and not limitation, where SC region 47 has lateral width 476, height differential 475 can be about 5% or more of lateral width 476, but larger and smaller percentages can also result. Manufacturing stage 507 is especially useful for SC regions 47 having width 476 in the range of about 10 to 100 nanometers, more particularly in the range of about 14 to 65 nanometers, but larger and smaller SC regions 47 can also be used.

Figure 4:
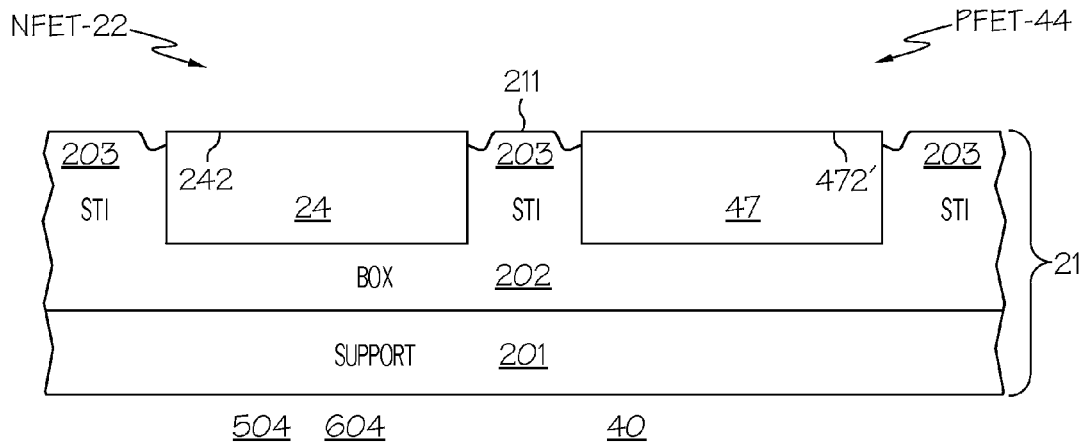
FIGS. 4-9 show simplified cross-sectional views of the device or IC portion of FIG. 3 during various stages of manufacture, according to further embodiments of the invention.
Figure 6:
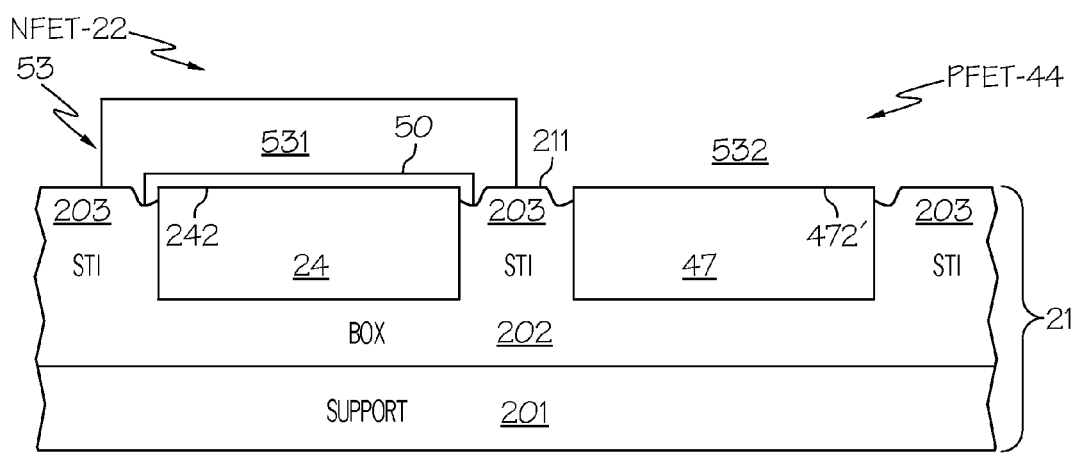

Referring now to manufacturing stage 508 of FIG. 8, as explained in more detail in connection with FIGS. 10-13, epitaxial layer or region 43 (e.g., of Si—Ge) of thickness 431 is formed substantially only over upper surface 472 of SC region 47. The prime (') has been dropped from reference number 472 identifying the upper surface of SC region 47 in FIGS. 7-9 to indicate that original surface 472' of SC region 47 of FIGS. 4-6 is modified before formation of epitaxial layer or region 43 as described in more detail in connection with FIG. 10, to incorporate the surface curvature that leads to improved uniformity of thickness 431 of epi-layer 43. The presence of protective layer 50 over surface 242 of SC region 24 allows epi-layer 43 to form over surface 472 of SC region 47 without also forming over surface 242 of SC region 24. STI regions 203 conveniently provide a similar "no epi-growth" function on the remainder of upper surface 211 of substrate 21. Conditions and material combinations for obtaining such selective epi-growth on semiconductors are well known in the art. Structure 608 results.

Figure 9:
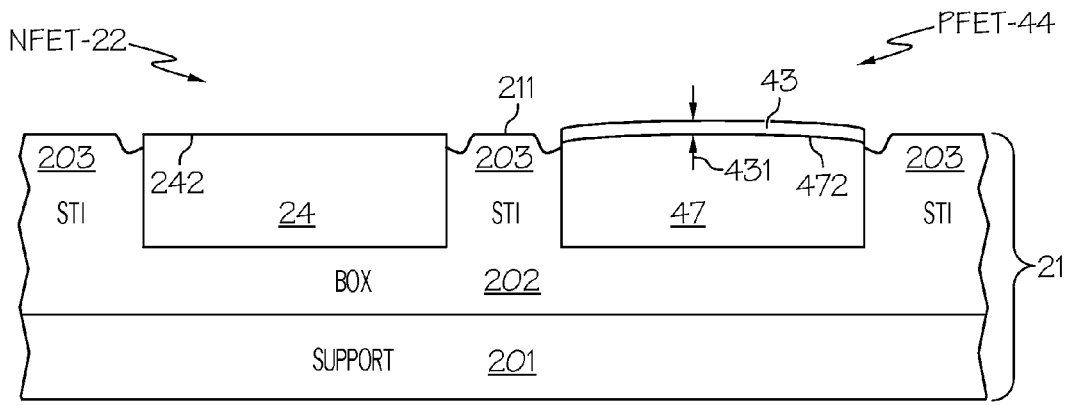

Referring now to manufacturing stage 509 of FIG. 9, structure 608 is conveniently etched to remove protective layer 50 overlying surface 242 of SC region 24. When the material of protective layer 50 is differentially etchable with respect to STI regions 203, the material of SC regions 24, 47 and the material of epi-layer 43, a blanket etch may be conveniently used for removing protective layer 50. Otherwise a conventional masking step may be utilized to protect those portions of the surface of substrate 21 that are not intended to be significantly etched during removal of layer 50. Either procedure is useful. Structure 609 results.

Referring now to FIGS. 9 and 3, structure 609 is subjected to conventional processing steps to form gate insulator or dielectric 48 overlying epi-layer or region 43, to form gate conductor 49 overlying gate insulator 48, to form dielectric sidewalls 491 on gate 49, and to form source-drain regions 471 within SC region 74 of PFET 44, in any convenient order. Similarly, insulator 25 is formed over surface 242 of SC region 24, gate conductor 26 is formed over insulator 25, dielectric sidewalls 261 are formed on gate 26 and source-drain regions 241 are formed in SC region 24 of NFET 22, in any convenient order. Such manufacturing stages are conventional and well known in the art and may be of the "gate first" or "gate last" or other variety. Either arrangement is useful. Device 40 of FIG. 3 results. Electrical contacts (not shown) are conventionally provided to source-drain regions 241, 471 and gates 26, 49 and such regions may be interconnected in any manner desired by the designer of the integrated circuit (IC) of which device 40 forms a part. Such "back-end" processing steps are conventional and well known in the art.

Figure 8:
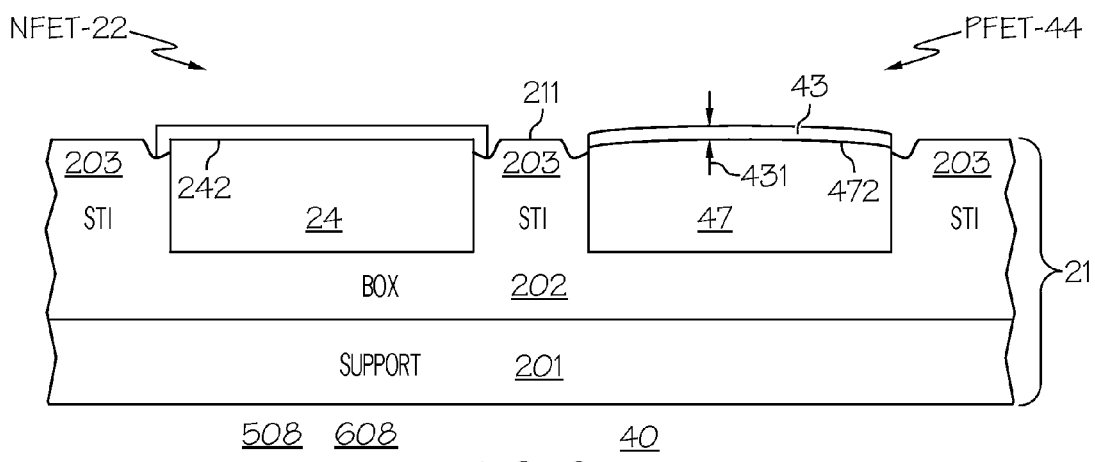
Figure 10:
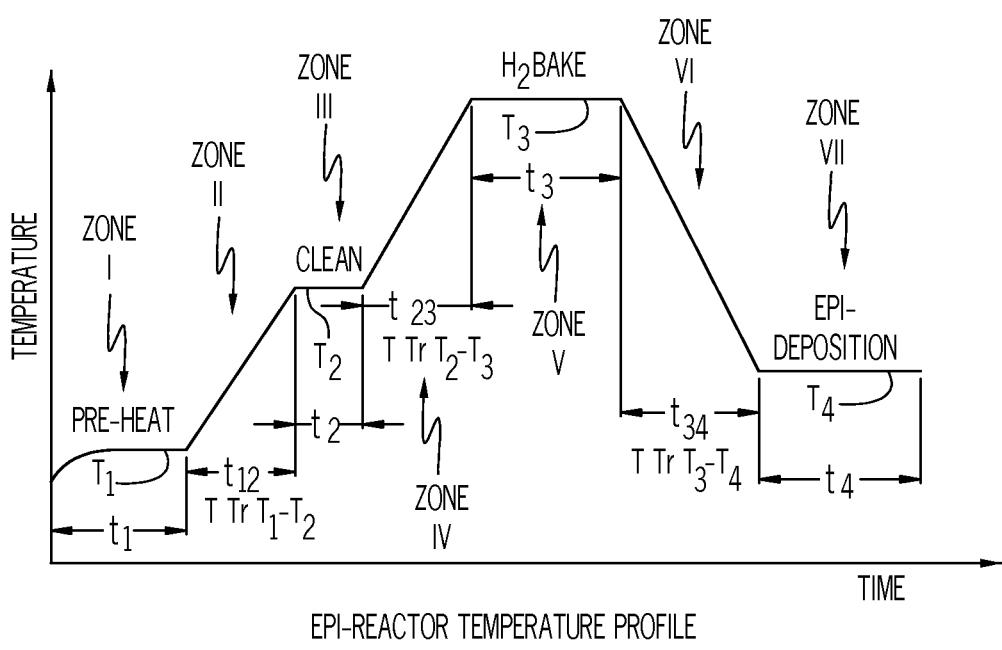
FIG. 10 shows a temperature versus time profile used in connection with formation of the epitaxial channel region of the device or IC portion of FIGS. 3-9, according to still further embodiments of the invention.

As illustrated in FIGS. 3 and 8-9, thickness 431 of epi-layer 43 is substantially uniform across SC region 47, certainly much more uniform than thickness 331 of epi-layer 33 above region 37 of FIG. 2, even though formed in the same epitaxial deposition reactor tool (epi-reactor). As noted above, this is substantially accomplished by modifying the pretreatment conditions to which substrate 21 of FIG. 7 is exposed prior to deposition of epi-layer 43. FIG. 10 illustrates desirable epi-reactor temperature-time profile 60 according to still further embodiments of the invention. Temperature-time profile 60 may be divided into approximately seven temperature-time ZONES I through VII described below. The pressure of the atmosphere within the epi-reactor during these several time-temperature ZONES is usefully in the range of about $10^1$ to $10^3$ milli-Torr, more conveniently about 100 to 800 milli-Torr and preferably about 300 to 500 milli-Torr, although higher and lower pressures can also be used. Unless otherwise specifically noted, an inert atmosphere is suitable.

Multiple substrates 21 are placed a high volume epi-reactor (not shown) and desirably subjected sequentially to ZONES I through VII of time-temperature profile 60 In time-temperature ZONE I, substrates 21 have substantially the configuration shown by structure 606 of FIG. 6 with mask 53 removed. In the course of the treatment associated with ZONES I through VII of time-temperature profile 60, the configuration of substrates 21 changes from structure 606 (less mask 53) of FIG. 6 to structure 608 of FIG. 8 with epi-layer 43 in place. The operations performed on substrates 21 during ZONES I through VII of time-temperature profile 60 are desirably:

ZONE I=PRE-HEAT ZONE, during which multiple substrates 21 on which it is desired to form epi-layer 43 are placed in the epi-reactor, warmed and allowed to soak for time $t_1$ so as to reach a substantially uniform temperature $T_1$. Temperature $T_1$ is usefully in the range of about 20 to 1000 degrees Celsius, more conveniently in the range of about 200 to 800 degrees Celsius and preferably about 400 degrees Celsius. Persons of skill in the art will understand that time $t_1$ should be long enough to allow substrates 21 to substantially equilibrate at temperature $T_1$.

ZONE II=TEMPERATURE TRANSITION (TTr) ZONE, during which substrates 21 within the epi-reactor are raised from temperature $T_1$ to temperature $T_2$ (e.g., abbreviated as TTr $T_1$-$T_2$). Time $t_{12}$ required for this operation will depend upon the particular epi-reactor being used and is within the competence of those of skill in the art. For the Kokusai epi-reactor mentioned earlier, about 10 to 120 minutes is suitable for $t_{12}$ of TTr $T_1$-$T_2$, but longer or shorter times can also be used in various embodiments.

ZONE III=CLEANING ZONE, during which substrates 21 within the epi-reactor are exposed to cleaning agents at temperature T2 for time t2 to remove any oxide, resist residuals or other contamination that may be on upper surface 472' of SC regions 47. Persons of skill in the art will understand that the choice of cleaning agent depends upon the substrate materials being used and contamination likely to be encountered. For silicon substrates, halogen atmospheres are useful with hydrogen-chloride gas being preferred for such cleaning and/or contamination removal, but other atmospheres may also be used.

ZONE IV=TEMPERATURE TRANSITION (TTr) ZONE, during which substrates 21 are raised from temperature $T_2$ to temperature $T_3$ (abbreviated as TTr-$T_2$-$T_3$) over time $t_{23}$. Time $t_{23}$ required for this operation will depend upon the particular epi-reactor being used and is within the competence of those of skill in the art. For the Kokusai tool mentioned earlier, about 10 to 500 minutes is suitable for $t_{23}$ of TTr $T_2$-$T_3$, but longer or shorter times can also be used in various embodiments.

ZONE V=REDUCING ATMOSPHERE BAKE ZONE during which substrates 21 are exposed to a preferably flowing reducing atmosphere, as for example but not intended to be limiting, to flowing hydrogen gas at temperature $T_3$ for time $t_3$. Temperature $T_3$ is usefully in the range of from about 500 to 1500 degrees Celsius and more conveniently in the range of from about 700 to 1000 degrees Celsius and preferably about 810 to 830 degrees Celsius, but other temperatures may also be used in other embodiments. Time $t_3$ is usefully in the range of from about 1 to 100 minutes and more conveniently less than about 30 minutes, and preferably about 15 to 25 minutes, but other larger or smaller times may also be used.

It was found that baking substrates 21 in flowing hydrogen at flow rates of less than about 4 standard liters per minute (slm) at temperatures greater than about 800 degrees Celsius for times less than 30 minutes gave superior results in terms of the uniformity of thickness 431 of epitaxial Si—Ge layers 43 (e.g., see FIGS. 3 and 9). The uniformity of thickness 431 obtained with the combination of hydrogen flow rate of about 1 standard liter per minute, at about 820 degrees Celsius for about 20 minutes at about 300 milli-Torr was significantly superior to the uniformity of thickness 431 obtained with the combination of about 4 standard liter per minute, at about 800 degrees Celsius for about 30 minutes at about 300 milli-Torr. This was found to beneficially change the curvature of surface 472' illustrated in FIG. 6 to the convex-outward shape of surface 472 illustrated in FIG. 7. While it is believed that the surface etching resulting in convex-outward curved surface 472 occurs primarily during ZONE V, some etching of surface 472' may also occur during the cleaning operation of ZONE III. So far as the end result depicted in FIG. 7 is concerned, it does not matter. As a consequence of the convex-outward curvature formed as described above, epitaxial growth of layer 43 during ZONE VII is much more uniform across SC region 47 so that thickness 431 of epi-layer 43 formed on surface 472 of FIG. 8 is likewise much more uniform (e.g., see FIG. 8).

ZONE VI=TEMPERATURE TRANSITION (TTr) ZONE, during which substrates 21 within the epi-reactor are lowered from temperature $T_3$ to temperature $T_4$ (abbreviated as TTr $T_3$-$T_4$) during time period $t_{34}$. Time $t_{34}$ required for this operation will depend upon the particular epi-reactor being used and is within the competence of those of skill in the art. For the Kokusai reactor identified earlier, about 100 to 1000 minutes is suitable for $t_{34}$ of TTr $T_3$-$T_4$, but longer or shorter times can also be used in various embodiments.

ZONE VII=EPITAXIAL DEPOSITION ZONE, during which substrates 21 within the epi-reactor are exposed to reactant gases containing the semiconductor materials desired to form epi-layer 43 at temperature $T_4$ for time $t_4$. For the Kokusai tool, temperature $T_4$ is usefully in the range of about 300 to 800 degrees Celsius, more conveniently in the range of about 400 to 600 degrees Celsius and preferably in the range of about 470 to 490 degrees Celsius, but larger and smaller and variable temperatures and pressures may also be used. Time $t_4$ is usefully in the range of about 1 to 60 minutes and preferably in the range of about 10 to 30 minutes depending upon desired thickness 431 of epi-layer 43, but larger and smaller times may also be used.

Stated another way, temperature $T_2$ is desirably greater than temperature $T_1$ and less than temperature $T_3$. Temperature $T_4$ is less than temperature $T_3$ and preferably also less than temperature $T_2$. However, other temperatures and times may also be used in other embodiments. Following ZONE VII, the epi-reactor and substrates 21 therein, wherein devices 40 now correspond to structure 608 of FIG. 8, may be cooled in any reasonable manner, for example in a protective atmosphere, and substrates 21 then sent on to further processing into finished devices such as have been described earlier.

Figure 11:
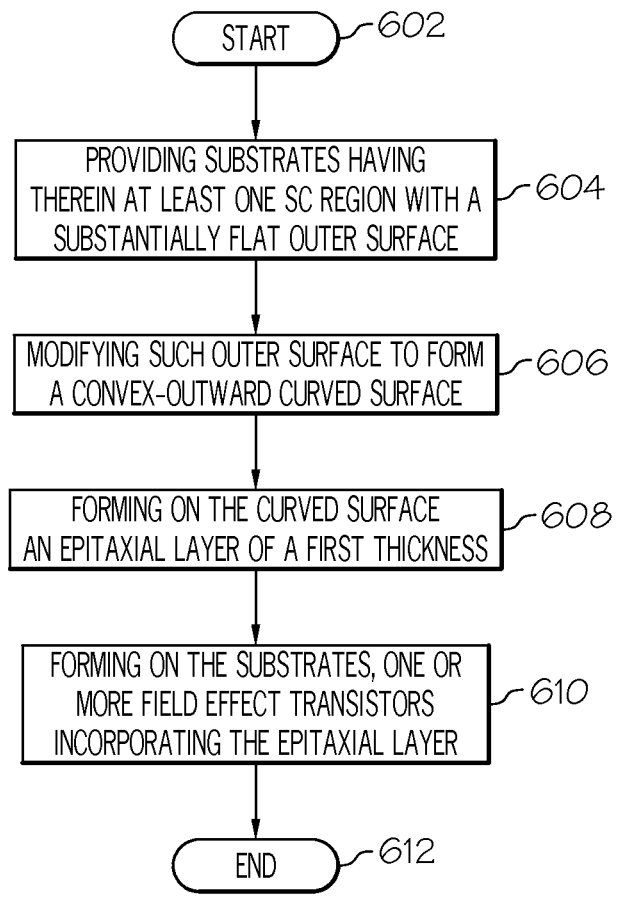
FIG. 11-13 show simplified block diagrams of methods for forming the device or IC portion incorporating the epitaxial channel region illustrated in FIGS. 3-9, according to yet further embodiments of the invention.
Figure 12:
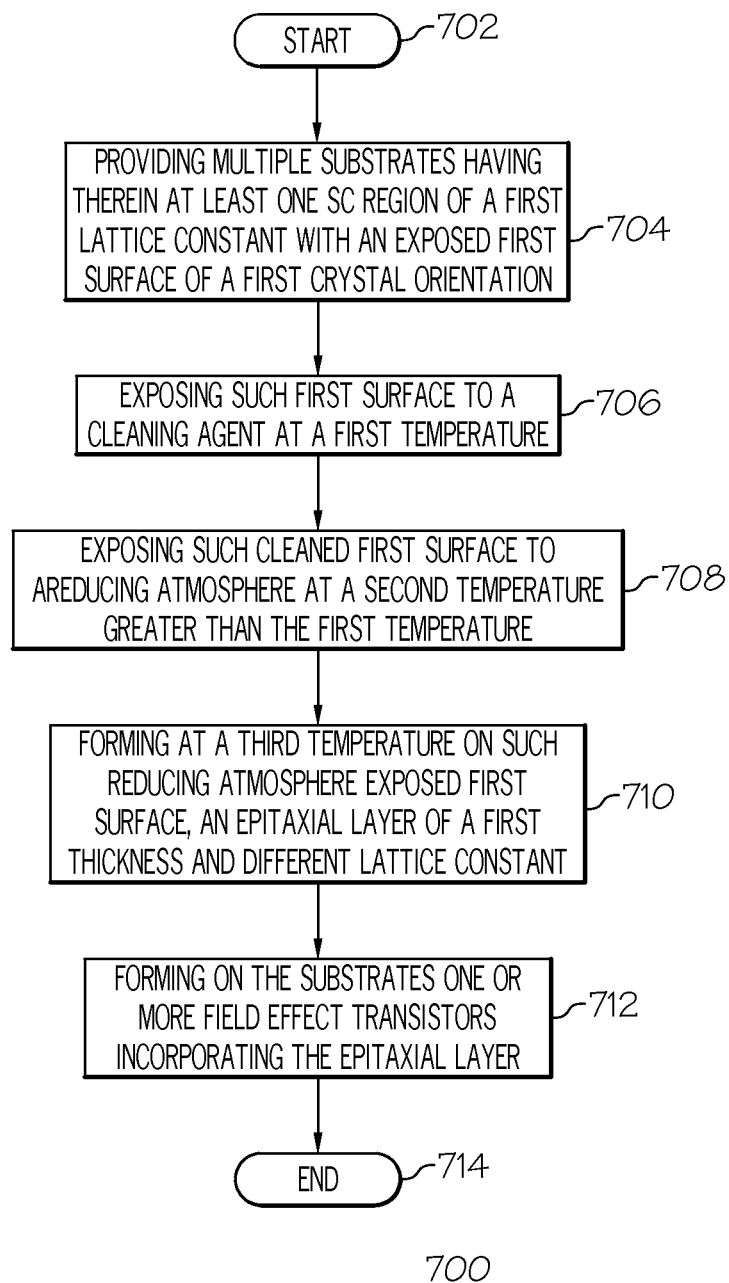
Figure 13:
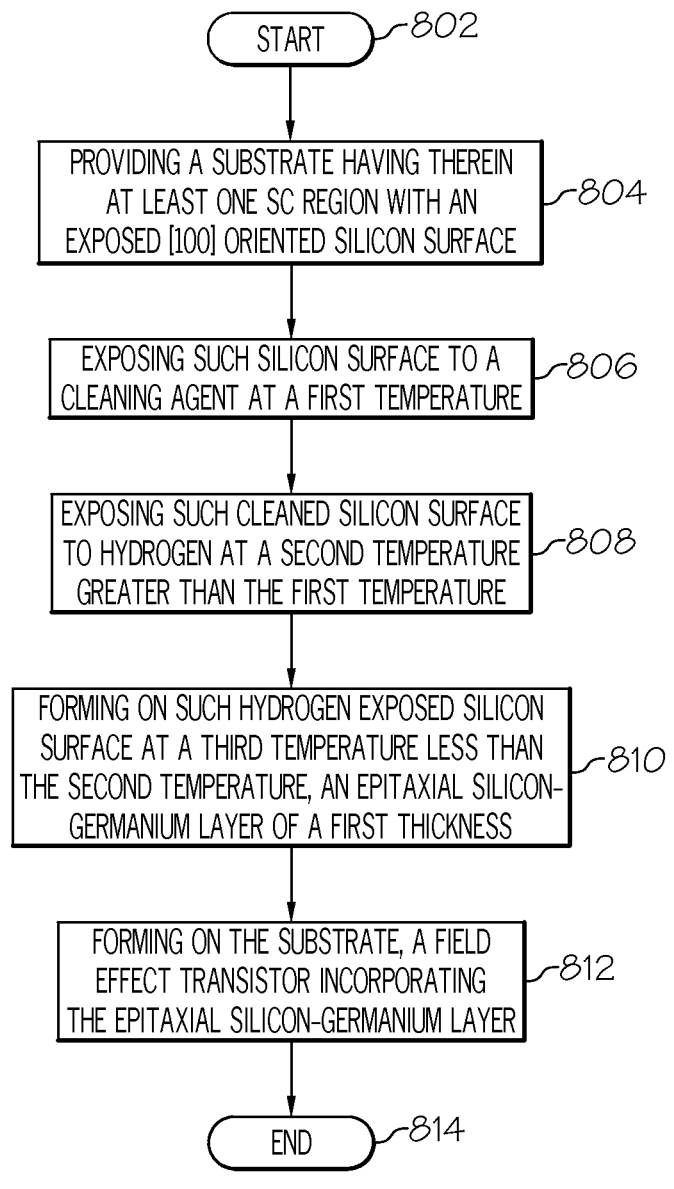

FIG. 11-13 show simplified block diagrams of methods 600, 700, 800 for forming device or IC portion 40 incorporating epitaxial channel region 43 illustrated in FIGS. 3-9, according to still further embodiments of the present invention. Referring now to FIG. 11, method 600 begins with START 602 and initial step 604 wherein multiple substrates (21) are provided having therein at least one semiconductor (SC) region (47) with a substantially flat outer surface (472'). In block 606, such outer surface (472') is modified to form a convex-outward curved surface (472). In block 608, an epitaxial layer (43) of a first thickness (431) is formed on the curved surface. In block 610, one or more field effect transistors (44) incorporating the epitaxial layer (43) is formed on the substrates (21). Method 600 then proceeds to END 612. As used herein the term formed "on" the substrate (21) should be understood to include those regions (e.g., region 471) that are "in" the substrate (21) as well as those regions (e.g., 43, 48, 49, 491) that are "on" or "above" the surface (472) of the substrate (21).

In another embodiment of method 600, step 604 further includes providing at least one semiconductor region (47) having a first lattice constant and step 608 further includes forming an epitaxial layer (43) having a second lattice constant different than the first lattice constant. In an additional embodiment, step 604 further includes providing at least one semiconductor region (47) of a first semiconductor material and step 608 further includes forming an epitaxial layer (43) of a second semiconductor material different than the first semiconductor material. In yet another embodiment, step 604 further includes providing at least one semiconductor region (47) of silicon semiconductor and step 608 further includes forming an epitaxial layer (43) of a silicon-germanium semiconductor material. In still another embodiment, step 606 further includes modifying such outer surface (472') by exposing it to flowing hydrogen at a temperature above about 800 degrees Celsius. In still yet another embodiment, the hydrogen is flowing at a rate of less than about 4 standard liters per minute (slm).

FIGS. 12-13, are conveniently discussed together. Method 700 of FIG. 12 describes a process for forming field effect transistors (44). Method 700 begins with START 702 and initial step 704 wherein there is provided multiple substrates (21) having at least one semiconductor (SC) region (47) of a first lattice constant with an exposed first surface (472') of a first crystal orientation. Method 800 of FIG. 13 describes a process for forming in an epi-reactor adapted to process multiple substrates (21) per batch, a field effect transistor (44) with an epitaxial channel region (43). Method 800 begins with START 802 and initial step 804 wherein there is provided a substrate (21) having therein at least one semiconductor (SC) region (47) with an exposed [100] oriented silicon surface (472).

Method 700 continues with step 706 wherein such first surface (472') is exposed to a cleaning agent at a first temperature ($T_2$). Method 800 continues with step 806 wherein such silicon surface (472') is exposed to a cleaning agent at a first temperature ($T_2$). Method 700 continues with step 708 wherein such cleaned first surface (472) is exposed to a reducing atmosphere at a second temperature ($T_3$) greater than the first temperature ($T_2$). Method 800 continues with step 808 wherein such cleaned silicon surface (472) is exposed to hydrogen at a second temperature ($T_3$) greater than the first temperature ($T_2$).

Method 700 continues with step 710 wherein an epitaxial layer (43) of a first thickness (431) and having a second, different, lattice constant is formed on such exposed first surface (472) at a third temperature ($T_4$). Method 800 continues with step 810 wherein an epitaxial silicon-germanium layer (43) of a first thickness (431) is formed on such hydrogen exposed silicon surface (472) at a third temperature ($T_4$) less than the second temperature ($T_3$). As noted earlier, in further embodiments, the third temperature ($T_4$) may also be less than the first temperature ($T_2$).

Method 700 continues with step 712 wherein there is formed on the substrates (21) a field effect transistor (44) incorporating the epitaxial layer (43). Method 800 continues with step 812 wherein there is formed on the substrate (21) a field effect transistor (44) incorporating the silicon-germanium epitaxial layer (43) in the channel region thereof. Methods 700 and 800 then proceed to END 714, 814 respectively.

In yet further embodiments of methods 700 and 800, the preheat step illustrated in Zone I of FIG. 10 may also be included between steps 704 and 706 and/or between steps 804 and 806, wherein the substrates (21) within the epitaxial reactor are pre-heated to an initial temperature ($T_1$) less than the first temperature ($T_2$), and then subjected to a temperature transition TTr $T_1$-$T_2$ to bring the substrates to the first temperature ($T_2$) suitable for cleaning step 706, 806.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described and methods of preparation in an exemplary embodiment without departing from the scope of the invention as set forth in the appended claims and their legal equivalents.

What is claimed is:

1. A method for forming a field effect transistor (FET), comprising:
    providing multiple substrates, each of the multiple substrates having therein at least one semiconductor (SC) region with a substantially flat outer surface;
    modifying such substantially flat outer surface of each of the multiple substrates to form a convex-outward curved surface, wherein the step of modifying is performed on each of the multiple substrates simultaneously using a single fabrication tool;
    forming an epitaxial layer of a first thickness on the curved surface of each of the multiple substrates, wherein the step of forming is performed on each of the multiple substrates simultaneously using the single fabrication tool, and wherein the epitaxial layer has a substantially uniform thickness; and
    incorporating the epitaxial layer of each of the multiple substrates in one or more field effect transistors formed on the substrates, wherein a gate electrode of the one or more field effect transistors is formed entirely over the epitaxial layer.

2. The method of claim 1, wherein providing substrates having therein at least one semiconductor (SC) region, comprises providing a semiconductor region comprising silicon semiconductor.

3. The method of claim 2, wherein forming an epitaxial layer, comprises, forming an epitaxial layer comprising silicon-germanium.

4. The method of claim 3, wherein forming an epitaxial layer comprising silicon-germanium, comprises forming an epitaxial layer comprising between substantially about 50% silicon to 50% germanium and about 90% silicon to 10% germanium.

5. The method of claim 1, wherein incorporating the epitaxial layer in a field effect transistor, comprises, incorporating the epitaxial layer in a channel region of the field effect transistor.

6. The method of claim 1, wherein:
    modifying such substantially flat outer surface occurs at least partially at a first temperature ($T_3$); and
    forming an epitaxial layer occurs at least partially at a second temperature ($T_4$) different than the first temperature ($T_3$).

7. The method of claim 6, wherein the second temperature ($T_4$) is less than the first temperature ($T_3$).

8. The method of claim 1, wherein:
    providing substrates having therein at least one semiconductor (SC) region comprises providing a SC region having a first lattice constant; and
    forming an epitaxial layer comprises forming an epitaxial layer having a second lattice constant different than the first lattice constant.

9. The method of claim 1, wherein modifying such outer surface to form a convex-outward curved surface, comprises, exposing such outer surface to flowing hydrogen at a temperature ($T_3$) exceeding 800 degrees Celsius.

10. The method of claim 9, wherein exposing such outer surface to flowing hydrogen comprises exposing to hydrogen flowing at less than 4 standard liters per minute.

11. The method of claim 7, wherein the steps of modifying and forming are performed in sequence in the single fabrication tool while the multiple substrates remain within the single fabrication tool, and wherein the single fabrication tool comprises a high-volume epitaxial reactor.

12. The method of claim 11, wherein the multiple substrates comprises up to about 100 substrates.

13. The method of claim 12, wherein the substantially uniform first thickness of the epitaxial layer is about 0.1 to about 20 nanometers.

* * * * *